United States Patent [19]

Sekiya

[11] Patent Number: 5,030,858

[45] Date of Patent: Jul. 9, 1991

[54] PREVENTION AGAINST NOISE OF DIGITAL AUDIO CIRCUIT

[75] Inventor: Mamoru Sekiya, Kani, Japan

[73] Assignee: Shin-Shirasuna Electric Corp., Nagoya, Japan

[21] Appl. No.: 554,096

[22] Filed: Jul. 19, 1990

Related U.S. Application Data

[63] Continuation of Ser. No. 240,648, Sep. 6, 1988, abandoned.

[30] Foreign Application Priority Data

Sep. 30, 1987 [JP] Japan .............................. 62-149397[U]

[51] Int. Cl.⁵ .......................... H03B 1/00; H03K 5/00
[52] U.S. Cl. ...................... 307/520; 328/167; 328/151; 330/9
[58] Field of Search ............... 307/520, 521, 352, 353; 328/151, 167, 165; 330/9

[56] References Cited

U.S. PATENT DOCUMENTS

| | | | |
|---|---|---|---|
| 4,343,001 | 7/1982 | Sauer | 330/9 |
| 4,429,239 | 1/1984 | Gay | 307/352 |
| 4,728,811 | 3/1988 | Iida et al. | 307/353 |
| 4,743,872 | 5/1988 | Tanimoto | 330/9 |

FOREIGN PATENT DOCUMENTS

| | | | |
|---|---|---|---|
| 0110766 | 8/1979 | Japan | 330/9 |
| 0130608 | 8/1983 | Japan | 330/9 |
| 613560 | 12/1984 | Japan . | |

OTHER PUBLICATIONS

Allstot et al., "MOS Switched Capacitor Ladder Filters", IEEE Journal of SSC, vol. SC-13, No. 6, Dec. 1978, pp. 806-814.

Gregorian, "Filtering Techniques with S-C Circuits", Microelectronics Journal, vol. 11, No. 2, Mar./Apr. 1980.

Mavor, "A Prototype Switched-Cap. Voltage-Wave filter Realized in NMOS Technology", IEEE SSC, vol. SC-16, No. 6, 12/81.

Primary Examiner—Timothy P. Callahan
Attorney, Agent, or Firm—Armstrong, Nikaido, Marmelstein, Kubovcik & Murray

[57] ABSTRACT

A noise prevention circuit of a digital audio circuit having an input side and an output side includes a signal level retention circuit having first and second inputs and first and second outputs, for retaining a level of a transmitted signal; and a switch circuit operably coupled to the signal level retention circuit for respectively connecting the first and second inputs of the retention circuit to an active line and a ground line of the input side of the digital audio circuit. The retention circuit receives and retains input signal from the active line and the ground line of the input side of the digital audio circuit, and for alternatively connecting an active line and a ground line of the output side of the digital audio circuit. The retention circuit outputs the retained signal in the signal level retention circuit from the first and second outputs of the signal level retention circuit to the active line and the ground line of the output side of the digital audio circuit. The signal level retention circuit separates the active line from the ground line of the input side of the audio circuit, and separates the active line from the ground line of the output side of the digital audio circuit.

6 Claims, 3 Drawing Sheets

PREVENTION AGAINST NOISE OF DIGITAL AUDIO CIRCUIT

This application is a continuation of application Ser. No. 240,648 filed Sept. 6, 1988, now abandoned.

BACKGROUND OF THE INVENTION (1) Field of the Invention

The present invention relates to a prevention against noise of a digital audio circuit.

(2) Prior Art

Development in the field of digital electronic engineering today has contributed to the popularity of digitization of audio equipment.

In an audio reproducing equipment, a digital audio disk for which signal processing is digitized has been realized including digitization of the control unit.

FIG. 1 is a block diagram showing a configuration of conventional digital audio disk player, wherein an optical deck mechanism 10 comprises a disk motor 11, a light pickup 12 and a feed motor of the light pickup, each of which is controlled by an optical deck control circuit 20. RF signal from the light pickup 12 is reshaped by a pre-amplifier 30 and sent to a digital signal circuit 40.

The digital signal circuit 40 comprises a synchronous detection circuit 41, a digital signal processing circuit 42, and a crystal oscillator 43 working as a clock pulse generating source, an output of digital signal is sent to a digital-analog converter 50 through a digital signal line 44 to have the digital signal converted into an analog signal, separated then into left and right analog signals, and is sent to an analog signal circuit 60 through an analog signal line 51.

The analog signal circuit 60 comprises low-pass filters 61, and an analog signal is output from output terminals 62.

A system control unit 70 comprises an operation key 72, a display 73 and a system control circuit 71.

Then, each unit is packaged in high density in one cabinet to constitute a digital audio disk player.

Meanwhile, a clock pulse signal generated by the crystal oscillator 43 and a current fluctuation due to operation of logical elements constituting the system control circuit 71 and the digital signal processing circuit 42 effect themselves a noise source.

The noises are transferred directly or indirectly to the analog signal circuit 60 through electrostatic and magnetic coupling among the units packaged in high density, thus impairing the standard of an analog signal output.

To cope with the problem mentioned above, a prevention taken hitherto is such that the portion whereas noise is produced and the analog signal circuit 60 are shielded, or a filter is inserted therein to thereby remove the noise.

As a result, a noise component can effectively be retained at a practical level as the analog signal output thereby.

However, such method is still not effective in removing thoroughly an influence of the noise transferred through the analog signal line 51, and thus a satisfactory high analog audio signal output is not obtainable for high fidelity sound reproducing.

SUMMARY OF THE INVENTION

In a digital audio circuit comprising converting a digital signal into an analog signal, the prevention against noise of a digital audio circuit according to the invention is constructed such that the circuit includes a signal level retention circuit for retaining a signal level according to the signal to transmit, and a switch circuit for disconnecting a signal line and an earth line partly and connecting the signal level retention circuit to each disconnected end of the signal line and the earth line alternately, the signal line and the earth line are connected to a signal line and an earth line of the signal level retention circuit, and after transferring ring the signal level from an input side to the signal level retention circuit, the signal line and the earth line of the signal level retention circuit are connected to the signal line and the earth line on an output side by the switch circuit, and thus the transferred signal level is transmitted further from the signal level retention circuit.

According to the above-mentioned construction, an object of the invention is to provide a prevention against noise of a digital audio circuit, whereby a transfer of noise generated in a digital audio circuit is suppressed, and thus a high audio signal output with less noise and distortion is obtainable.

Other objects of the invention will be made apparent in the description given in detail hereinafter.

DESCRIPTION OF THE PREFERRED EMBODIMENTS

Figure 1:
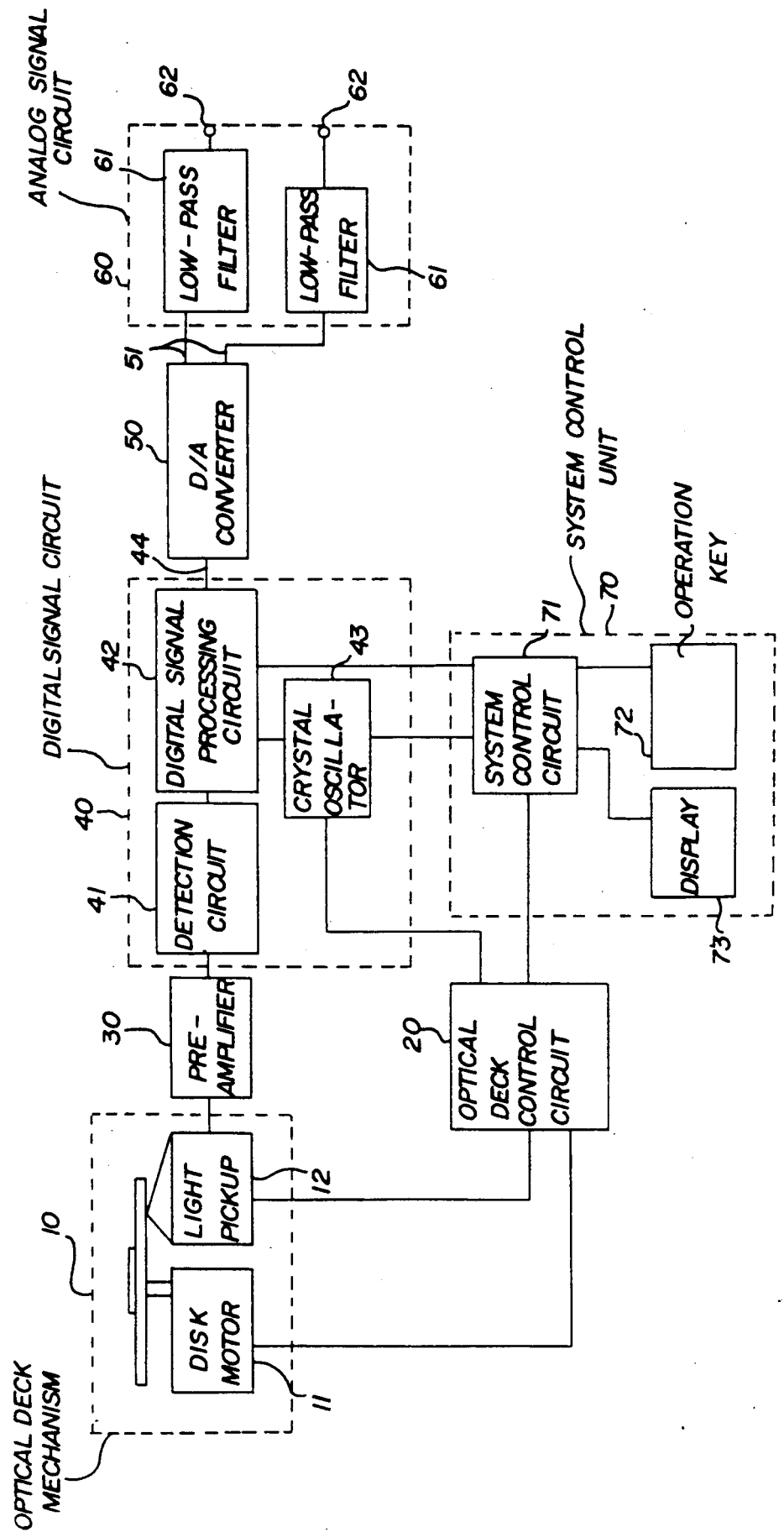
FIG. 1 is a block diagram of a prior art digital audio disk player.
Figure 2:
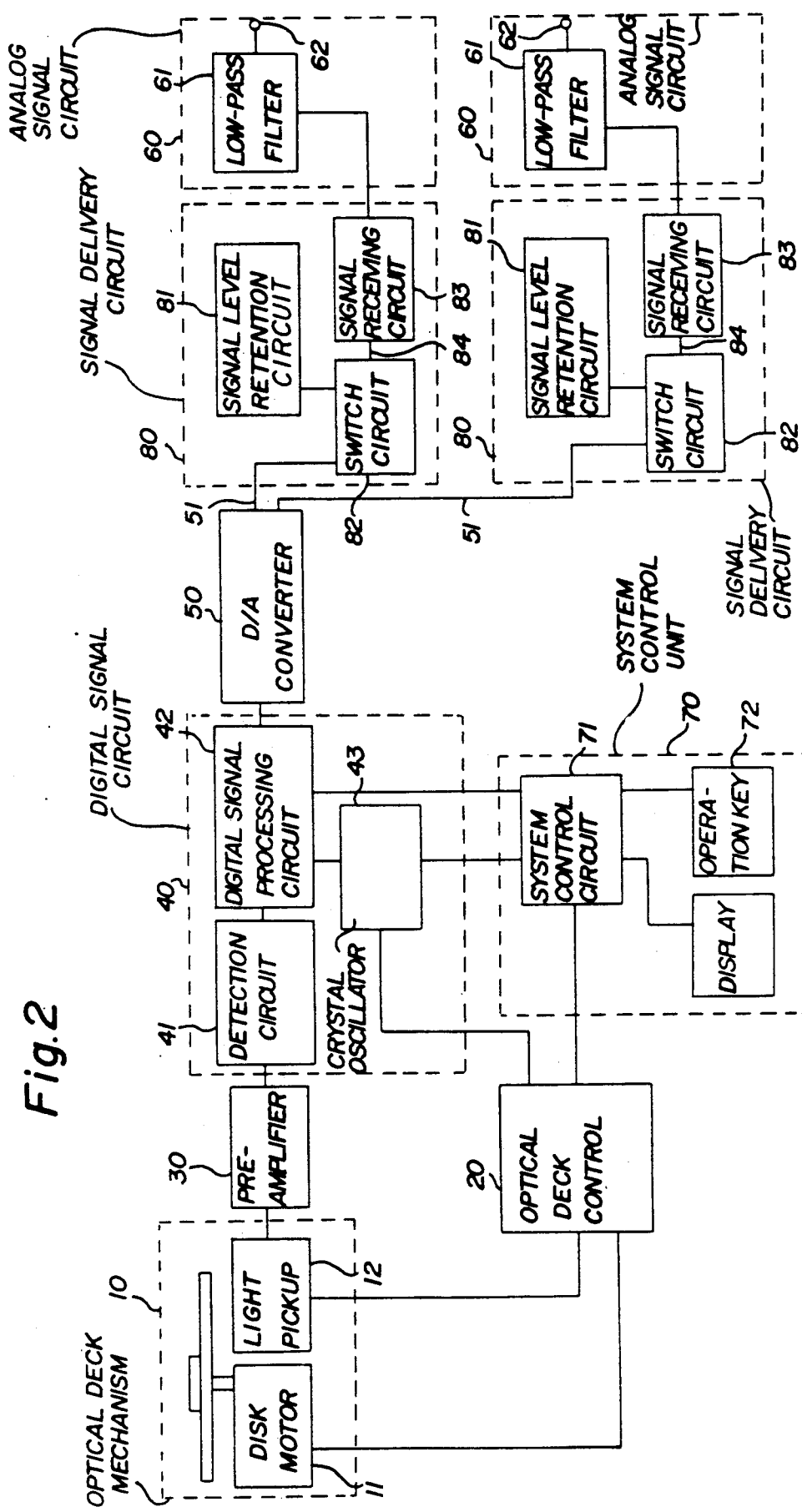
FIG. 2 is a block diagram of a digital audio disk player given in one embodiment of the invention.

FIG. 2 is a block diagram of a digital audio disk player according to the invention, wherein like reference numerals represent like parts in the prior art digital audio disk player (FIG. 1), and hence no further description will be repeated thereof here.

As shown in FIG. 2, signal delivery circuits 80 are connected each between output side of the digital-analog converter 50 and the analog signal circuits 60 provided in two systems for both left and right channels.

The signal delivery circuit 80 comprises a signal level retention circuit 81, a switch circuit 82 and a signal receiving circuit 83, an analog signal is once sent to the signal level retention circuit 81 by the switch circuit 82, sent further to the signal receiving circuit 83 by the switch circuit 82 through an analog signal line 84, and thus the signal is output to the analog signal circuit 60 from the signal delivery circuit 80. The signal receiving circuit 83 comprises a high input impedance circuit using, for example, capacitor and transistor.

Figure 3:
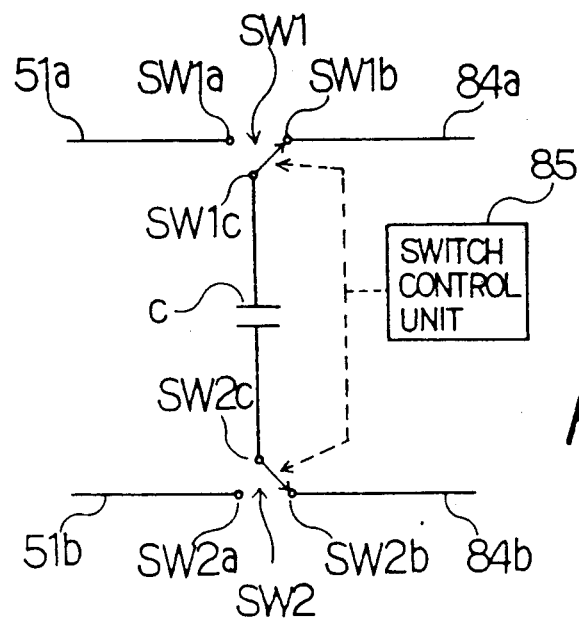
FIG. 3 is an operational diagram of a signal delivery circuit.

FIG. 3 illustrates a basic operation of the signal delivery circuit 80. The signal level retention circuit 81 comprises a condenser C which is a capacitor element, and the switch circuit 82 comprises two changeover switches SW1 and SW2 and a switch control unit 85 for controlling an operation of the changeover switches.

A terminal SW1a of the changeover switch SW1 and a terminal SW2a of the changeover switch SW2 are connected to a signal line 51a and an ground line 51b of the analog signal line 51 respectively, and a terminal SW1b of the changeover switch SW1 and a terminal SW2b of the changeover switch SW2 are connected to a signal line 84a and an earth line 84b of the analog signal line 84. A terminal SW1c of the changeover switch SW1 is connected to one end of the condenser C, and a terminal SW2c of the changeover switch SW2 is connected to the other end of the condenser C. Then, the terminal SW1c and the terminal SW2c are common terminals.

When changed concurrently to a side of the analog signal line 51 or to a side of the analog signal line 84, the changeover switches SW1 and SW2 are controlled by the switch control unit 85 so that both signal lines 51, 84 will be opened temporarily. A control is further made by the switch control unit 85 so that a period of reciprocation of the changing operation will coincide with the period wherein analog signals corresponding to each digital signal are inputted to the switch circuit 82 through the analog signal line 51.

A control signal of the switch control unit 85 for controlling the changeover switches is generated on a sampling signal of the digital signal processing circuit 42 which is applied to the switch control unit 85.

Figure 4:
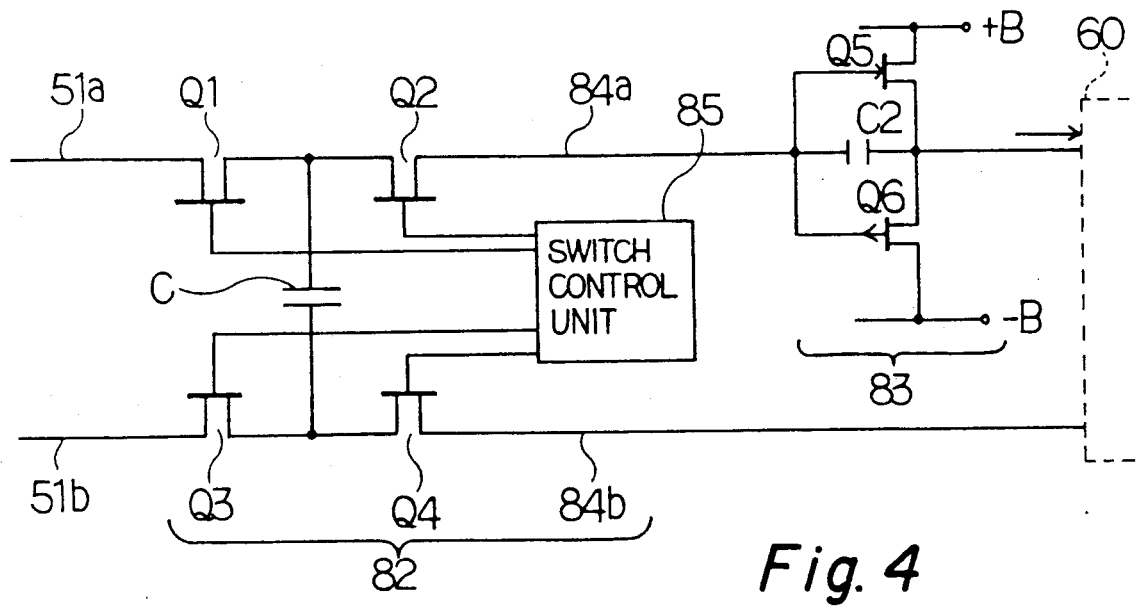
FIG. 4 is a basic circuit diagram of the signal delivery circuit.

FIG. 4 illustrates a concrete circuit of the signal delivery circuit 80 in FIG. 3.

The changeover switch SW1 comprises field effect transistors Q1, Q2, and the changeover switch SW2 comprises field effect transistors Q3, Q4. The switch control unit 85 is connected to gate terminals of the field effect transistors Q1, Q2, Q3, Q4, the signal line 84a is connected to the signal receiving circuit 83, and an output side of the signal receiving circuit 83 is connected to the analog signal circuit 60.

The signal receiving circuit 83 comprises a bootstrap circuit consisting of a condenser C2 and two field effect transistors Q5, Q6, the condenser C2 is connected in series to the signal line 84a, the field effect transistors Q5, Q6 are connected in parallel with the condenser C2 with the gates on input side and the sources on output side, and supply voltages +B and −B are impressed on drains of the transistors Q5, Q6.

From connecting the field effect transistors Q5, Q6 to the condenser C2 to construct a bootstrap circuit, a capacity of the condenser C2 for receiving signals is reduced apparently, thereby minimizing error or distortion arising at the time of signal receiving.

The switch control unit 85 outputs control signals to gate terminals of each transistor at a period of, for example, one per integer of the sampling period, and the output control signals will keep the field effect transistors Q2, Q4 non-conductive when the field effect transistors Q1, Q3 are conducting, and will in a reverse fashion also keep the field effect transistors Q1, Q3 non-conductive when the field effect transistors Q2, Q4 are conducting. As illustrated in FIGS. 2, 3 and 4, the D/A converter 50 includes first output and second output which are connected to the signal line 51a and ground line 51b, respectively, of the analog signal line 51.

An operation of the aforementioned main circuit will be described next.

A stepwise analog signal is output from the digital-analog converter 50, and when the transistors Q1, Q3 are conducting and the transistors Q2, Q4 are kept non-conductive on the control signals from the switch control unit 85 in this case, a voltage of the analog signal is stored in the condenser C as charge. Next, when the transistors Q1, Q3 are kept non-conductive and the transistors Q2, Q4 are conducting according to an operation of the switch control unit 85, the charge stored in the condenser C is discharged and sent to the signal receiving circuit 83 as a voltage signal. Next, the operation whereby the transistors Q1, Q3 are conducting and the transistors Q2, Q4 are kept non-conductive is repeated at the switch circuit 82, the voltage of analog signal is charged in the condenser C at every switching operations, and then discharged and outputted to the signal receiving circuit 83.

As described, the signal lines 51a, 84a and the ground lines 51b, 84b are separated perfectly when the signal is sent through the switch circuit 82, therefore noise from a clock pulse signal system and logic elements is prevented from being transferred to the analog signal circuit 60 through the signal lines 51a, 84a and the ground lines 51b, 84b, and thus an analog signal with less noise is obtainable.

Then, in the switch circuit 82 the field effect transistors are conducting, the signal voltage stored in the condenser C is discharged and sent to the signal receiving circuit 83, however, since the signal receiving circuit 83 constructs a bootstrap circuit, an apparent capacity of the signal receiving condenser C2 is reduced, and an input impedance is increased. Thus, when the signal voltage is impressed on the condenser C2, a voltage on the source side of the field effect transistors Q5, Q6 also rises, then a terminal voltage of the condenser C2 keeps the value almost the same as an initial value, and no charge will be produced in the condenser C2. Consequently, if there remains a charge in the condenser C2 in the signal receiving circuit 83, a level of the inputted signal will not come out as error, and thus a signal with less distortion may be delivered. Then, the analog signal output from the signal receiving circuit 83 is sent to the analog signal circuit 60.

Then, the construction wherein the signal delivery circuit 80 is disposed on output side of the digital-analog converter 50 is indicated; however, the signal delivery circuit 80 may be disposed on input side of the converter 50.

Further, the invention is not necessarily limited to a digital audio player of the above-described embodiment, and a similar effect of action to what has been described above will be obtainable. In other words, from applying the invention to a digital audio tape equipment intended for obtaining a high audio signal output and to an audio circuit of the equipment for converting a digital signal into an analog signal such as video disk player or the like.

As described, in the prevention against noise of a digital audio circuit according to the invention, a signal is transferred through the signal level retention circuit, and the signal line and the ground line are separated at all times, therefore a transfer of the noise component produced within the equipment which cannot be removed thoroughly according to the prior art method will be suppressed reasonably, and a high analog signal can be output to realize a clear high compass reproducing.

While the invention has been particularly shown and described in reference to preferred embodiments thereof, it will be understood by those skilled in the art that changes in form and details may be made therein without departing from the spirit and scope of the invention.

What is claimed is:

1. A noise prevention circuit of a digital audio circuit having an input side and an output side, comprising:

a signal level retention circuit means having first and second inputs and first and second outputs, for retaining a level of a transmitted signal;

a switch circuit means operably coupled to said signal level retention circuit means for respectively connecting said first and second inputs of said retention circuit means to an active line and a ground line of said input side of said digital audio circuit, wherein said retention circuit means receives and retains input signal from said active line and said ground line of said input side of said digital audio circuit, and wherein said switch circuit means alternately connects said first and second inputs of said retention circuit means to an active line and a ground line of said output side of said digital audio circuit, wherein said retention circuit means outputs said retained signal in said signal level retention circuit means from said first and second outputs of said signal level retention circuit means to said active line and said ground line of said output side of said digital audio circuit, wherein said signal level retention circuit means separates said active line from said ground line of said input side of said audio circuit, and separates said active line from said ground line of said output side of said digital audio circuit, and wherein said signal level retention circuit means has a capacitor element connected between said signal lines and said ground lines through said switch circuit means.

2. The noise prevention circuit as defined in claim 1, further comprising a signal receiving circuit means for receiving said signal retained in said signal level retention circuit means when said switch circuit means connects said first and second outputs of said signal level retention circuit means to said active and ground lines of said output side of said audio circuit.

3. The noise prevention circuit as defined in claim 2, wherein said signal receiving circuit means has a bootstrap circuit including at least one condenser and two transistors, said at least one condenser and said two transistors being operably connected to said signal line to said output side of said audio circuit.

4. A noise prevention circuit of a digital audio circuit having an input side and an output side, comprising:

a D/A converter having a first output and a second output;

a signal level retention circuit means having first and second inputs and first and second outputs, for retaining a level of a transmitted signal;

a switch circuit means operably coupled to said signal level retention circuit means for respectively connecting said first and second inputs of said retention circuit means to an active line and a ground line of said input side of said digital audio circuit, wherein said retention circuit means receives and retains input signal from said active line and said ground line of said input side of said digital audio circuit, and wherein said switch circuit means alternately connects said first and second inputs of said retention circuit means to an active line and a ground line of said output side of said digital audio circuit, wherein said retention circuit means outputs said retained signal in said signal level retention circuit means from said first and second outputs of said signal level retention circuit means to said active line and said ground line of said output side of said digital audio circuit, wherein said first output of said D/A converter is connected to said active line of said input side of said audio circuit, wherein said second output of said D/A converter is connected to said ground line of said input side of said audio circuit, wherein said signal level retention circuit means separates said active line from said ground line of said input side of said audio circuit, and separates said active line from said ground line of said output side of said digital audio circuit, and wherein said signal level retention circuit means has a capacitor element connected between said signal lines and said ground lines through said switch circuit means.

5. A noise prevention circuit of a digital audio circuit having an input side and an output side, comprising:

a signal level retention circuit means having first and second inputs and first and second outputs, for retaining a level of a transmitted signal;

a switch circuit means operably coupled to said signal level retention circuit means for respectively connecting said first and second inputs of said retention circuit means to an active line and a ground line of said input side of said digital audio circuit, wherein said retention circuit means receives and retains input signal from said active line and said ground line of said input side of said digital audio circuit, and wherein said switch circuit means alternately connects said first and second inputs of said retention circuit means to an active line and a ground line of said output side of said digital audio circuit, wherein said retention circuit means outputs said retained signal in said signal level retention circuit means from said first and second outputs of said signal level retention circuit means to said active line and said ground line of said output side of said digital audio circuit; and a signal receiving circuit means for receiving said signal retained in said signal level retention circuit means when said switch circuit means connects said first and second outputs of said signal level retention circuit means to said active and ground lines of said output side of said audio circuit, wherein said signal level retention circuit means separates said active line from said ground line of said input side of said audio circuit, and separates said active line from said ground line of said output side of said digital audio circuit, and wherein said signal level retention circuit means has a capacitor element connected between said signal lines and said ground lines through said switch circuit means.

6. A noise prevention circuit of a digital audio circuit having an input side and an output side, comprising:

a signal level retention circuit means having first and second inputs and first and second outputs, for retaining a level of a transmitted signal;

a switch circuit means operably coupled to said signal level retention circuit means for respectively connecting said first and second inputs of said retention circuit means to an active line and a ground line of said input side of said digital audio circuit, wherein said retention circuit means receives and retains input signal from said active line and said ground line of said input side of said digital audio circuit, and wherein said switch circuit means alternately connects said first and second inputs of said retention circuit means to an active line and a ground line of said output side of said digital audio circuit, wherein said retention circuit means outputs said retained signal in said signal level retention circuit means from said first and second outputs of said signal level retention circuit means to said active line and said ground line of said output side of said digital audio circuit; and a signal receiving circuit means for receiving said signal retained in said signal level retention circuit means when said switch circuit means connects said first and second outputs of said signal level retention circuit means to said active and ground lines of said output side of said audio circuit, wherein said signal level retention circuit means outputs a high analog signal for said digital audio circuit by separating said active line from said ground line of said input side of said audio circuit, and separating said active line from said ground line of said output side of said digital audio circuit to thereby suppress transfer of noise component from said audio circuit, and wherein said signal level retention circuit means has a capacitor element connected between said signal lines and said ground lines through said switch circuit means.

* * * * *